US007535397B1

United States Patent
Chiou et al.

(10) Patent No.: US 7,535,397 B1
(45) Date of Patent: May 19, 2009

(54) DIGITAL-TO-ANALOG CONVERTER AND THE METHOD THEREOF

(75) Inventors: Yu-Wen Chiou, Sinshih Township, Tainan County (TW); Jiunn-Yau Huang, Sinshih Township, Tainan County (TW)

(73) Assignee: Himax Technologies Limited (TW)

( * ) Notice: Subject to any disclaimer, the term of this patent is extended or adjusted under 35 U.S.C. 154(b) by 0 days.

(21) Appl. No.: 12/100,261

(22) Filed: Apr. 9, 2008

(30) Foreign Application Priority Data

Jan. 14, 2008 (TW) .............................. 97101393 A

(51) Int. Cl.
*H03M 1/66* (2006.01)
(52) U.S. Cl. ........................................ 341/145; 345/89
(58) Field of Classification Search ......... 341/140–144; 345/87–94
See application file for complete search history.

(56) References Cited

U.S. PATENT DOCUMENTS 5,347,294 A * 9/1994 Usui et al. .................... 345/89
7,123,224 B2 * 10/2006 Lee .............................. 345/89
7,161,517 B1 * 1/2007 Yen et al. ..................... 341/145
7,327,299 B2 * 2/2008 Yen et al. ..................... 341/145
2007/0001955 A1 * 1/2007 Lee .............................. 345/89

* cited by examiner

*Primary Examiner*—Lam T Mai
(74) *Attorney, Agent, or Firm*—Hayes Soloway P.C.

(57) ABSTRACT

A digital-to-analog converter (DAC) is provided for converting an (X+Y)-bit input word, which includes an X-bit MSB subword and a Y-bit LSB subword, into a current signal. The DAC has an X-bit voltage DAC section and a Y-bit current DAC section. The X-bit voltage DAC section generates an intermediate voltage corresponding to the X-bit MSB subword. The Y-bit current DAC section generates a reference current corresponding to the intermediate voltage and outputs the current signal derived by multiplying the reference current by a factor corresponding to the Y-bit LSB subword. In addition, a method for digital-to-analog conversion of an (X+Y)-bit input word into a current signal is also provided.

9 Claims, 4 Drawing Sheets

DIGITAL-TO-ANALOG CONVERTER AND THE METHOD THEREOF

RELATED APPLICATIONS

This application claims priority to Taiwan Application Serial Number 97101393, filed Jan. 14, 2008, which is herein incorporated by reference.

BACKGROUND

1. Field of Invention

The present invention relates to a driver circuit of a display. More particularly, the present invention relates to a digital-to-analog converter (DAC) in the driver circuit.

2. Description of Related Art

Those skilled in the art know that various DAC architectures are available, such as a resistor string (R-string) DAC. FIG. 1 illustrates a conventional R-string DAC. An R-string DAC 100 includes a selector 122 and several resistors 112. By the selector 122, the connecting nodes between the resistors 112 constitute tap points selectively switched to an output node in response to a digital input. The voltage of one tap point, which is selected to couple to the output node, is an inherently monotonic analog representation of the digital input.

DACs are generally used in a driver circuit of an OLED (Organic Light Emission Display) to accomplish the modulations of brightness, contrast or gray scale for OLED pixels. Particularly, for a current-type AMOLED (Active-Matrix Organic Light Emission Display), the DAC finally should outputs a current rather than a voltage for driving the OLED pixel. For example, the DAC may be of a pure current-type architecture, which modulates its output by multiplying currents with transistors of different length-to-width ratios.

However, when the output of the DAC needs more variations, such as the digital input of more bits is applied or more gray scales are required in design, the transistors necessarily will occupy larger valuable area in the driver circuit. Alternatively, the DAC of a pure voltage-type architecture whose output voltage is subsequently converted into a current is very complex and hard to decide the tap point, increasing the difficulty of circuitry design.

SUMMARY

According to one embodiment of the present invention, a digital-to-analog converter (DAC) is provided for converting an (X+Y)-bit input word, which includes an X-bit MSB subword and a Y-bit LSB subword, into a current signal. The DAC comprises an X-bit voltage DAC section and a Y-bit current DAC section. The X-bit voltage DAC section generates an intermediate voltage corresponding to the X-bit MSB subword. The Y-bit current DAC section generates a reference current corresponding to the intermediate voltage and outputs the current signal derived by multiplying the reference current by a factor corresponding to the Y-bit LSB subword.

According to another embodiment of the present invention, a method is provided for digital-to-analog conversion of an (X+Y)-bit input word, which includes an X-bit MSB subword and a Y-bit LSB subword, into a current signal. An intermediate voltage is generated corresponding to the X-bit MSB subword. A reference current is generated corresponding to the intermediate voltage. The current signal is derived by multiplying the reference current by a factor corresponding to the Y-bit LSB subword.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
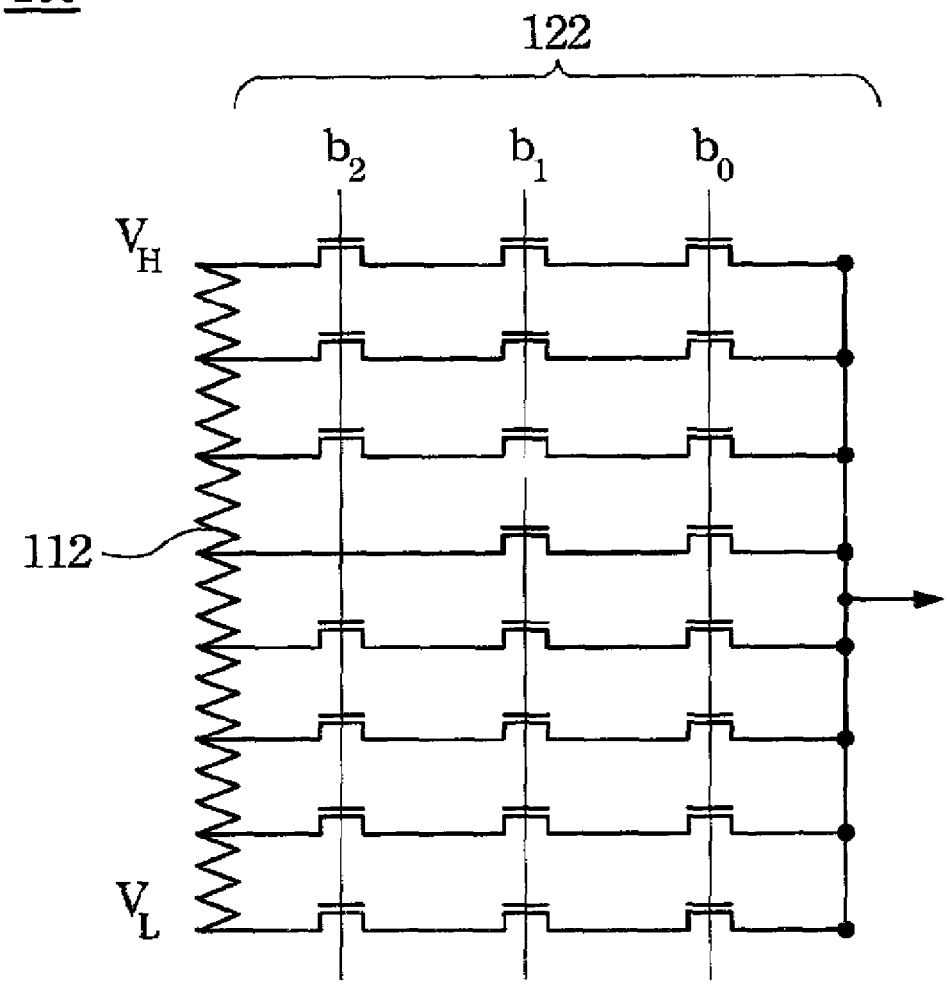
FIG. 1 illustrates a conventional R-string DAC.

Reference will now be made in detail to the present preferred embodiments of the invention, examples of which are illustrated in the accompanying drawings. Wherever possible, the same reference numbers are used in the drawings and the description to refer to the same or like parts.

Figure 2:
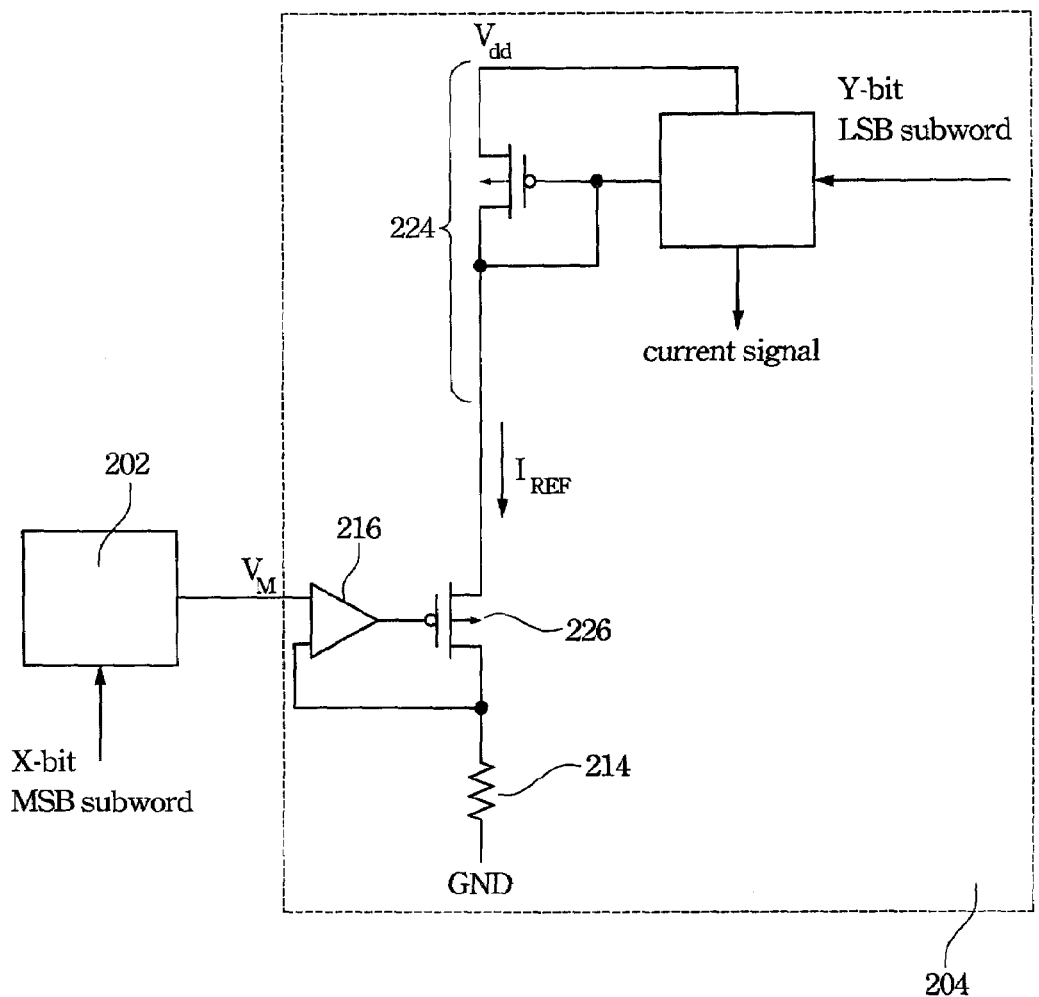
FIG. 2 is a DAC according to one embodiment of the present invention.

FIG. 2 is a digital-to-analog converter (DAC) 200 according to one embodiment of the present invention. The DAC 200 is provided for converting an (X+Y)-bit input word into a current signal, and the (X+Y)-bit input word includes an X-bit MSB subword and a Y-bit LSB subword. The DAC 200 has an X-bit voltage DAC section 202 and a Y-bit current DAC section 204. The X-bit voltage DAC section 202 generates an intermediate voltage ($V_M$) corresponding to the X-bit MSB subword. The Y-bit current DAC section 204 generates a reference current ($I_{REF}$) corresponding to the intermediate voltage ($V_M$) and outputs the current signal derived by multiplying the reference current ($I_{REF}$) by a factor corresponding to the Y-bit LSB subword.

The (X+Y)-bit input word can be a digital signal, such as a digital video signal, a digital audio signal or other suitable digital signal requiring to be converted into a current signal. In this embodiment, the DAC 200 is provided for use in an OLED to accomplish the modulations of brightness, contrast or gray scale for OLED pixels. The (X+Y)-bit input word is a digital video signal, and the current signal is a grayscale current. Moreover, the (X+Y)-bit input word is assumed to be a 6-bit input word, the X-bit MSB subword is assumed to be a 2-bit MSB subword, and the Y-bit LSB subword is assumed to be a 4-bit LSB subword.

Figure 3:
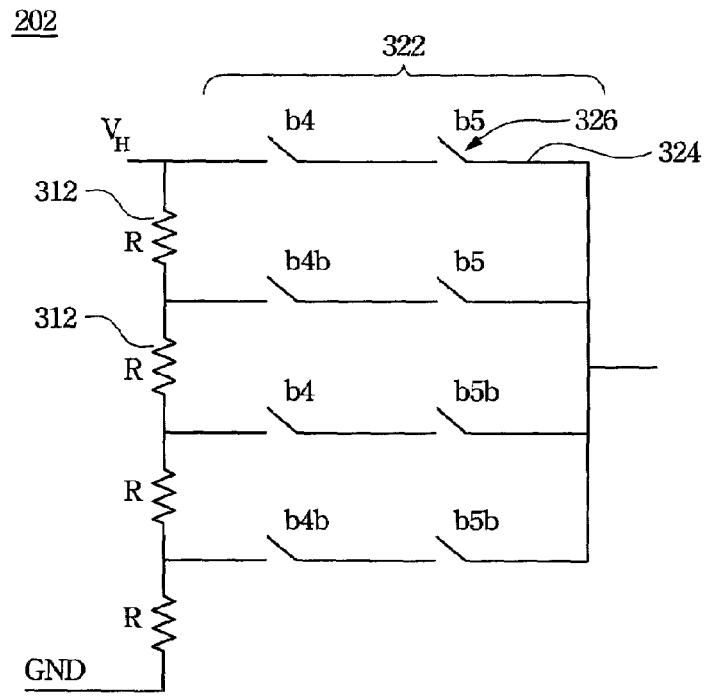
FIG. 3 illustrates the X-bit voltage DAC section according to the embodiment.

FIG. 3 illustrates the X-bit voltage DAC section 202 according to the embodiment. The X-bit voltage DAC section 202 has several resistors 312 and a selector 322. The resistors 312 are electrically connected in series between a high reference voltage ($V_H$) and a low reference voltage (GND) and constitute tap points to provide several voltage levels. The selector 322 is coupled to the series-connected resistors 312 and selects one of the voltage levels according to the X-bit MSB subword as the intermediate voltage ($V_M$).

More particularly, the selector 322 includes several selecting lines 332, and each of the selecting lines 332 is coupled to one of the tap points constituted by the series-connected resistors 312. Each selecting lines 332 has several switching elements 326, of which each is switched by one bit (e.g. b4 or b5) of the X-bit MSB subword, respectively. In practice, what is used to switch the switching elements 326 may be one bit of the X-bit MSB subword itself or the complement of the bit. By the selector 322, the voltage of the tap point, which is selected to couple to the output, can be an inherently monotonic analog representation of the X-bit MSB subword.

Referring to FIG. 2, the Y-bit current DAC section 204 has a resistor 214 and a current mirror 224. The resistor 214 converts the intermediate voltage ($V_M$) into the reference current ($I_{REF}$). That is, the X-bit voltage DAC section 202 provides the intermediate voltage ($V_M$) to an operational amplifier 216. The intermediate voltage ($V_M$) is thus applied to one end of the resistor 214 by the virtual connection of the two inputs of the operational amplifier 216. Once the input of the operational amplifier 216 gets a voltage, i.e. at the time the X-bit voltage DAC section 202 generating the intermediate voltage ($V_M$), the transistor 226 will be conduced.

Figure 4:
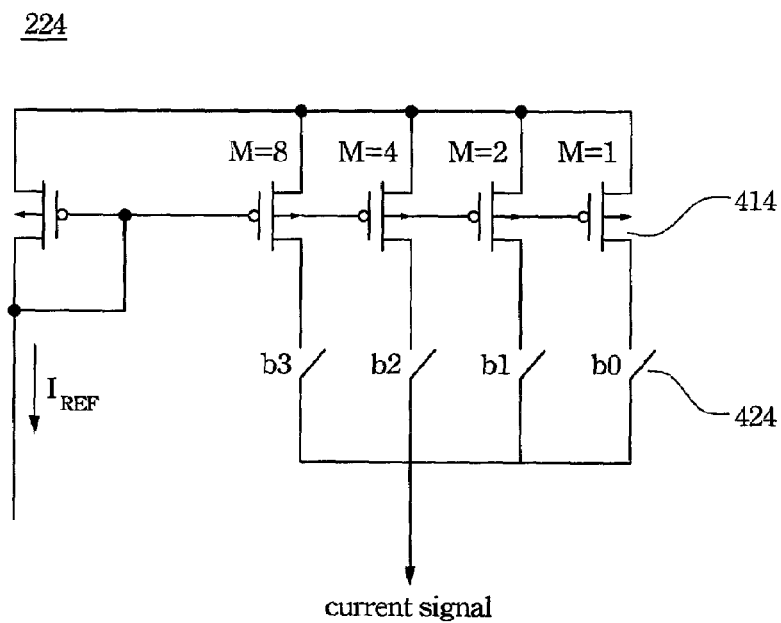
FIG. 4 illustrates the current mirror according to the embodiment.

Other electronic elements also can be implement to achieve the conversion between the intermediate voltage ($V_M$) and the reference current ($I_{REF}$), such as a transistor or other converting circuit. FIG. 4 illustrates the current mirror 224 according to the embodiment. The current mirror 224 mirrors a multiple of the reference current ($I_{REF}$) to each of several current paths, and each current path is conducted according to one bit (e.g. b0, b1, b2 or b3) of the Y-bit LSB subword and the current signal is a sum of currents flowing through the conducted current paths.

More particularly, there are a transistor 414 and a switch 424 connected in series in each of the current paths. The switch 424 is controlled by one bit (e.g. b0, b1, b2 or b3) of the Y-bit MSB subword, and the length-to-width ratios (M) of the transistors 414 in two current paths are different. That is, the conductings of the switches 424 and the different length-to-width ratios of the transistor 414 can determine the factor for multiplying the reference current ($I_{REF}$).

With the transistors 414 of the different length-to-width ratios (e.g. M=1, 2, 4 and 8), the current mirror 224 is able to provide more selections of the current amount for the current signal. For example, when the 4-bit LSB subword having four bits b0, b1, b2 and b4 is input into the Y-bit current DAC section 204, sixteen kinds of current signals can be selectively output by the current mirror 224.

The embodiment combines the current-type DAC and the voltage-type DAC to perform the conversions of partial bits of the input word, respectively. Therefore, the area occupied by the whole DAC can be reduced and the overall smooth design for an OLED driver circuit is improved.

Figure 5:
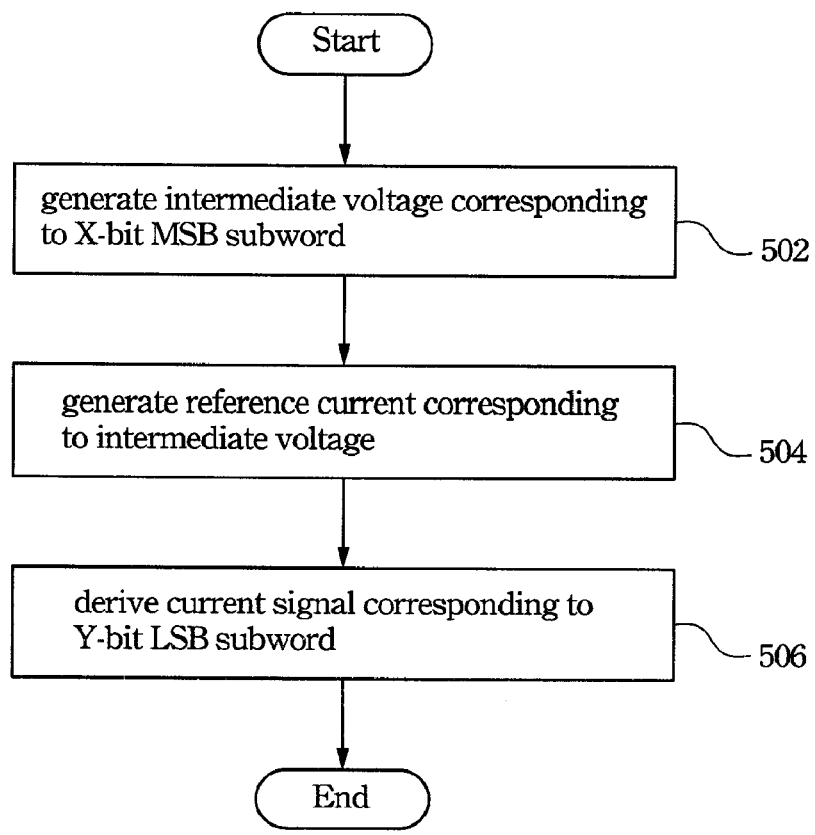
FIG. 5 is a flow chart of the method according to one embodiment of the present invention.

In another aspect, a method for digital-to-analog conversion of an (X+Y)-bit input word into a current signal is provided. FIG. 5 is a flow chart of the method according to one embodiment of the present invention. The (X+Y)-bit input word includes an X-bit MSB subword and a Y-bit LSB subword. Firstly, an intermediate voltage ($V_M$) is generated corresponding to the X-bit MSB subword (step 502). Next, a reference current ($I_{REF}$) is generated corresponding to the intermediate voltage ($V_M$) (step 504). Then, the current signal is derived by multiplying the reference current ($I_{REF}$) by a factor corresponding to the Y-bit LSB subword (step 506).

The (X+Y)-bit input word can be a digital signal, such as a digital video signal, a digital audio signal or other suitable digital signal requiring to be converted into a current signal. In this embodiment, the (X+Y)-bit input word is a digital video signal, and the current signal is a grayscale current. Moreover, the (X+Y)-bit input word is assumed to be a 6-bit input word, the X-bit MSB subword is assumed to be a 2-bit MSB subword, and the Y-bit LSB subword is assumed to be a 4-bit LSB subword.

More particularly, the deriving of the current signal can mirror a multiple of the reference current ($I_{REF}$) to each of several current paths, and each current path is conducted according to one bit of the Y-bit LSB subword and the current signal is a sum of currents flowing through the conducted current paths. In addition, the amounts of the currents flowing through the current paths are different from one another. Therefore, the conductings of the current paths and the amounts of the currents flowing through the current paths can determine the factor for multiplying the reference current ($I_{REF}$).

The embodiment combines the voltage-type and current-type conversion to achieve the conversion from a digital input word into a current signal. Therefore, the performance can be improved, such as reducing the chip area, mitigating the voltage swing, and decreasing the power consumption.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter (DAC) for converting an (X+Y)-bit input word, which includes an X-bit MSB subword and a Y-bit LSB subword, into a current signal, the DAC comprising:

an X-bit voltage DAC section generating an intermediate voltage corresponding to the X-bit MSB subword; and a Y-bit current DAC section generating a reference current corresponding to the intermediate voltage and outputting the current signal derived by multiplying the reference current by a factor corresponding to the Y-bit LSB subword.

2. The DAC as claimed in claim 1, wherein the X-bit voltage DAC section comprising:

a plurality of resistors electrically connected in series to provides a plurality of voltage levels; and a selector coupled to the series-connected resistors and selecting one of the voltage levels according to the X-bit MSB subword as the intermediate voltage.

3. The DAC as claimed in claim 1, wherein the Y-bit current DAC section comprising:

a resistor converting the intermediate voltage into the reference current; and a current mirror mirroring a multiple of the reference current to each of a plurality of current paths, wherein each current path is conducted according to one bit of the Y-bit LSB subword and the current signal is a sum of currents flowing through the conducted current paths.

4. The DAC as claimed in claim 3, wherein there are a transistor and a switch connected in series in each of the current paths, the switch is controlled by one bit of the Y-bit MSB subword, and the length-to-width ratios of the transistors in two current paths are different.

5. The DAC as claimed in claim 1, wherein the (X+Y)-bit input word is a digital video signal, and the current signal is a grayscale current.

6. A method for digital-to-analog conversion of an (X+Y)-bit input word, which includes an X-bit MSB subword and a Y-bit LSB subword, into a current signal, the method comprising the steps of:

generating an intermediate voltage corresponding to the X-bit MSB subword;

generating a reference current corresponding to the intermediate voltage; and deriving the current signal by multiplying the reference current by a factor corresponding to the Y-bit LSB subword.

7. The method as claimed in claim 6, wherein the (X+Y)-bit input word is a digital video signal, and the current signal is a grayscale current.

8. The method as claimed in claim 6, wherein the deriving of the current signal comprising:

mirroring a multiple of the reference current to each of a plurality of current paths, wherein each current path is conducted according to one bit of the Y-bit LSB subword and the current signal is a sum of currents flowing through the conducted current paths.

9. The method as claimed in claim 8, wherein amounts of the currents flowing through the current paths are different from one another.

* * * * *